United States Patent
Okura et al.

(10) Patent No.: US 10,236,853 B2
(45) Date of Patent: Mar. 19, 2019

(54) ELECTRONIC COMPONENT

(71) Applicant: Murata Manufacturing Co., Ltd., Kyoto (JP)

(72) Inventors: Ryo Okura, Nagaokakyo (JP); Hayami Kudo, Nagaokakyo (JP); Kenji Nishiyama, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/401,169

(22) Filed: Jan. 9, 2017

(65) Prior Publication Data
US 2017/0230026 A1 Aug. 10, 2017

(30) Foreign Application Priority Data
Feb. 5, 2016 (JP) .................................. 2016-021119

(51) Int. Cl.
| | |
|---|---|
| *H03H 7/01* | (2006.01) |
| *H01F 27/28* | (2006.01) |
| *H01F 27/40* | (2006.01) |
| *H01G 4/012* | (2006.01) |
| *H01G 4/08* | (2006.01) |
| *H01G 4/40* | (2006.01) |

(Continued)

(52) U.S. Cl.
CPC ....... *H03H 7/0115* (2013.01); *H01F 17/0013* (2013.01); *H01F 27/2804* (2013.01); *H01F 27/40* (2013.01); *H01G 4/012* (2013.01); *H01G 4/08* (2013.01); *H01G 4/129* (2013.01); *H01G 4/1272* (2013.01); *H01G 4/33* (2013.01); *H01G 4/40* (2013.01); *H01F 2017/0026* (2013.01); *H01F 2027/2809* (2013.01); *H03H 2001/0078* (2013.01); *H03H 2001/0085* (2013.01)

(58) Field of Classification Search
CPC ..................... H03H 2001/0085; H03H 7/0115
USPC ................................................. 333/175, 185
See application file for complete search history.

(56) References Cited

U.S. PATENT DOCUMENTS

| | | | | |
|---|---|---|---|---|
| 6,825,748 | B1 * | 11/2004 | Ibata ..................... | H01F 17/045 |
| | | | | 29/602.1 |
| 2002/0003281 | A1 * | 1/2002 | Ibata ................... | H01F 27/2804 |
| | | | | 257/531 |

(Continued)

FOREIGN PATENT DOCUMENTS

| | | |
|---|---|---|
| JP | S61-100006 U | 6/1986 |
| JP | 2006-157738 A | 6/2006 |
| JP | 2008-034626 A | 2/2008 |

OTHER PUBLICATIONS

An Office Action; "Notification of Reasons for Refusal," issued by the Japanese Patent Office dated Aug. 21, 2018, which corresponds to Japanese Patent Application No. 2016-021119 and is related to U.S. Appl. No. 15/401,169; with English language translation.

*Primary Examiner* — Rakesh B Patel
(74) *Attorney, Agent, or Firm* — Studebaker & Brackett PC

(57) ABSTRACT

An electronic component including a substrate, a capacitor lower electrode disposed on the substrate, an inorganic dielectric layer disposed on the substrate to cover the lower electrode, a capacitor upper electrode disposed directly on the inorganic dielectric layer and facing the lower electrode via the inorganic dielectric layer, and a coil disposed on the inorganic dielectric layer and electrically connected to the lower electrode or the upper electrode.

11 Claims, 9 Drawing Sheets

(51) Int. Cl.
*H01G 4/33* (2006.01)
*H01F 17/00* (2006.01)
*H01G 4/12* (2006.01)
*H03H 1/00* (2006.01)

(56) References Cited

U.S. PATENT DOCUMENTS

2009/0033439 A1* 2/2009 Igarashi .............. H01P 1/20345
                                                            333/185
2010/0165542 A1* 7/2010 Sohn ........................ C03C 3/095
                                                            361/313
2016/0307702 A1* 10/2016 Tanaka ..................... H01G 4/40

* cited by examiner

ELECTRONIC COMPONENT

CROSS REFERENCE TO RELATED APPLICATIONS

This application claims benefit of priority to Japanese Patent Application 2016-021119 filed Feb. 5, 2016, the entire content of which is incorporated herein by reference.

TECHNICAL FIELD

The present disclosure relates to an electronic component.

BACKGROUND

Conventional electronic components include an electronic component described in Japanese Patent Publication No. 2008-34626. This electronic component has a substrate, a capacitor lower electrode disposed on the substrate, a coil disposed on the substrate, an inorganic dielectric layer covering the coil, the substrate, and the lower electrode, and a capacitor upper electrode disposed on the inorganic dielectric layer and facing the lower electrode via the inorganic dielectric layer. The inorganic dielectric layer has a constant thickness and the inorganic dielectric layer is formed in conformity to the shapes of the coil, the substrate, and the lower electrode.

SUMMARY

Problem to be Solved by the Disclosure

It was found out that the following problem exists when the conventional coil component is actually manufactured and used. Since the coil is covered with the inorganic dielectric layer, a stray capacitance between wirings of the coil (inductor) increases in the inorganic dielectric layer. This leads to a deterioration in performance of the coil.

Therefore, a problem to be solved by the present disclosure is to provide an electronic component capable of suppressing a reduction in performance of the coil.

Solutions to the Problems

To solve the problem, the present disclosure provides an electronic component comprising
a substrate;
a capacitor lower electrode disposed on the substrate;
an inorganic dielectric layer disposed on the substrate to cover the lower electrode;
a capacitor upper electrode disposed directly on the inorganic dielectric layer and facing the lower electrode via the inorganic dielectric layer; and
a coil disposed on the inorganic dielectric layer and electrically connected to the lower electrode or the upper electrode.

According to the electronic component of the present disclosure, since the coil is disposed on the inorganic dielectric layer, the stray capacitance between the wirings of the coil (inductor) does not increase in the inorganic dielectric layer, so that a reduction in performance of the coil can be suppressed.

In one embodiment of the electronic component, a thickness of a portion lateral to the lower electrode in the inorganic dielectric layer is thicker than a thickness of a portion between the lower electrode and the upper electrode in the inorganic dielectric layer.

According to the embodiment, a thickness of a portion lateral to the lower electrode in the inorganic dielectric layer is thicker than a thickness of a portion between the lower electrode and the upper electrode in the inorganic dielectric layer. As a result, at least an edge part on the lower side of the lower electrode can be covered with the inorganic dielectric layer having a thicker film thickness. Therefore, the inorganic dielectric layer can be prevented from deteriorating in coverage of the edge part of the lower electrode and, even when thermal distortion etc. are generated, a structural defect such as a crack can be prevented in the portion covering the edge part of the lower electrode in the inorganic dielectric layer. Therefore, the reliability of quality can be restrained from degrading.

In an embodiment of the electronic component, the upper surface of the inorganic dielectric layer is flat.

In this case, being flat means that a maximum height between a recess and a protrusion in a surface uneven shape is 1 μm or less.

According to the embodiment, since the upper surface of the inorganic dielectric layer is flat, the inorganic dielectric layer does not have a shape along the lower electrode. As a result, the upper and lower edge parts of the lower electrode can be covered with the inorganic dielectric layer having a thicker film thickness. Therefore, a structural defect can be prevented in the portion covering the upper and lower edge parts of the lower electrode in the inorganic dielectric layer.

In an embodiment of the electronic component, the coil and the lower electrode are separated in a horizontal direction without facing each other.

According to the embodiment, since the coil and the lower electrode are separated in a horizontal direction without facing each other, the stray capacitance can be reduced in the inorganic dielectric layer between the coil and the lower electrode.

In an embodiment of the electronic component, a thickness of at least a portion of a coil conductor constituting the coil is thicker than the thickness of the lower electrode.

According to the embodiment, a thickness of at least a portion of a coil conductor constituting the coil is thicker than the thickness of the lower electrode. As a result, a direct current resistance value of the coil can be made smaller to improve the coil characteristics.

In an embodiment of the electronic component, the thickness of at least a portion of the coil conductor is 5 μm or more and 15 μm or less, and the thickness of the lower electrode is 1 μm or less.

According to the embodiment, since the thickness of at least a portion of the coil conductor is 5 μm or more and 15 μm or less, and the thickness of the lower electrode is 1 μm or less, the electronic component with a small direct current resistance value can be formed by a SAP (semi-additive process) method.

Effect of the Disclosure

According to the electronic component of the present disclosure, the stray capacitance between the wirings of the coil does not increase in the inorganic dielectric layer, so that a reduction in performance of the coil can be suppressed.

DETAILED DESCRIPTION

The present disclosure will now be described in detail with reference to shown embodiments.

First Embodiment

Figure 1:
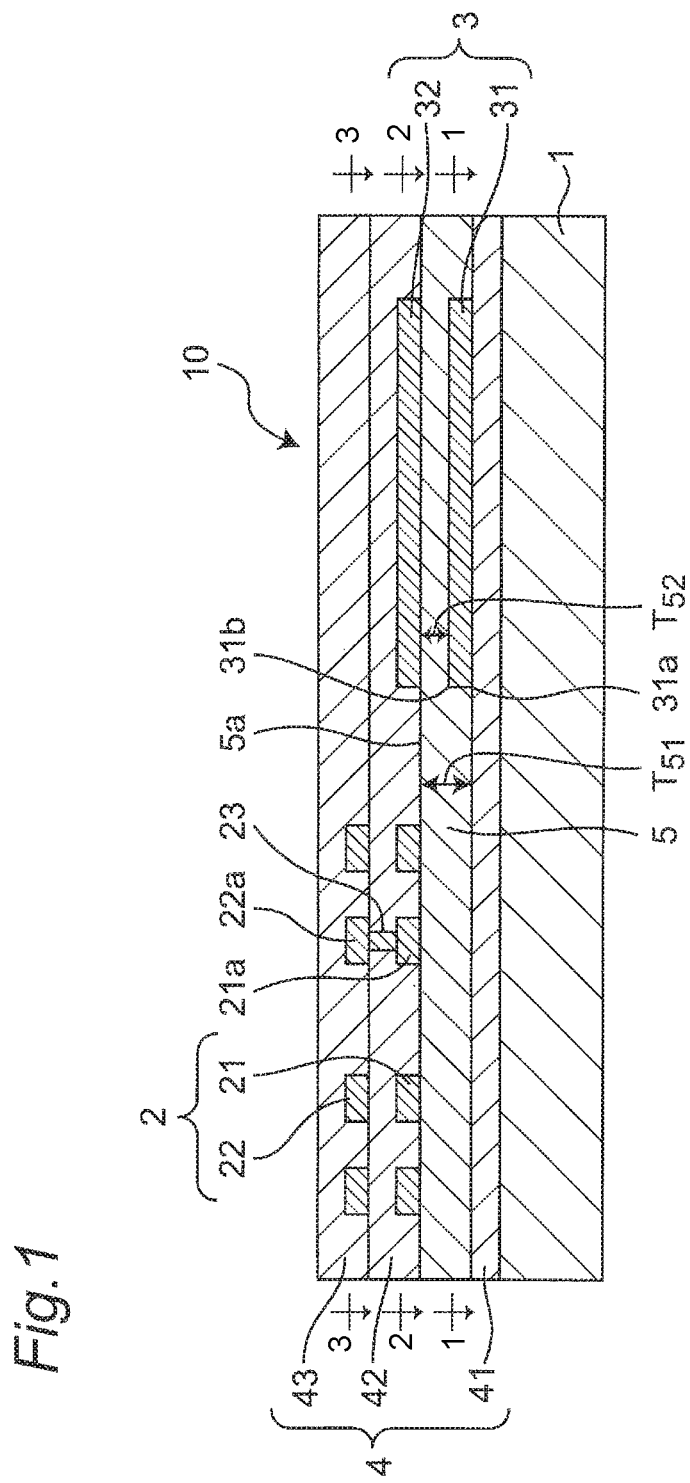
FIG. 1 is a cross-sectional view of a first embodiment of an electronic component of the present disclosure.
Figure 2A:
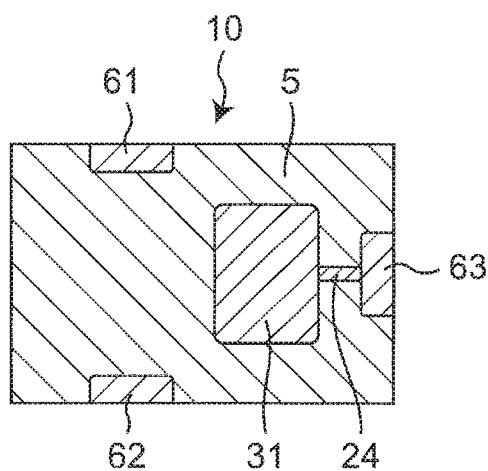
FIG. 2A is a cross-sectional view taken along 1-1 of FIG. 1.
Figure 2B:
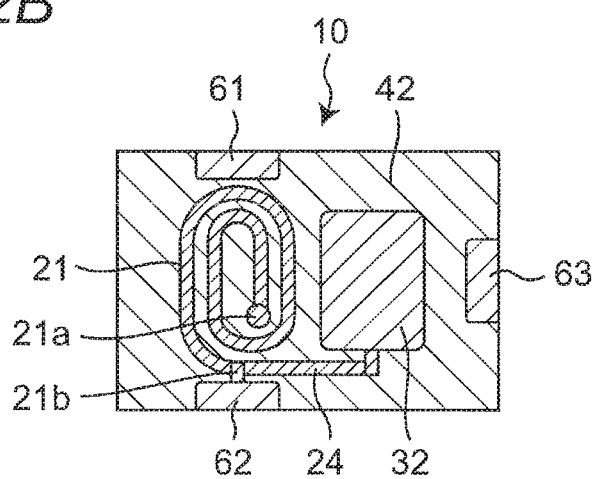
FIG. 2B is a cross-sectional view taken along 2-2 of FIG. 1.
Figure 2C:
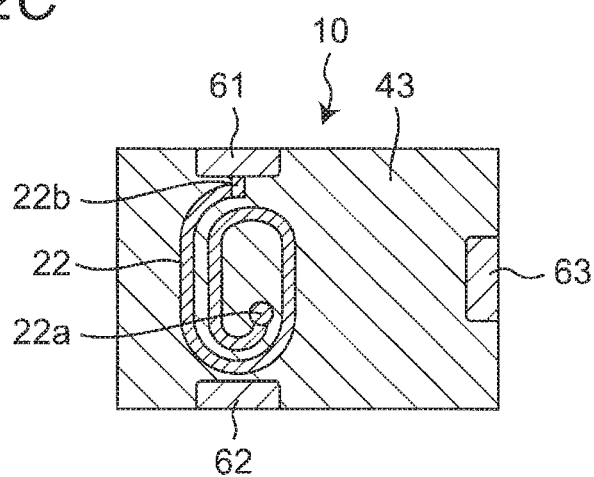
FIG. 2C is a cross-sectional view taken along 3-3 of FIG. 1.
Figure 3:
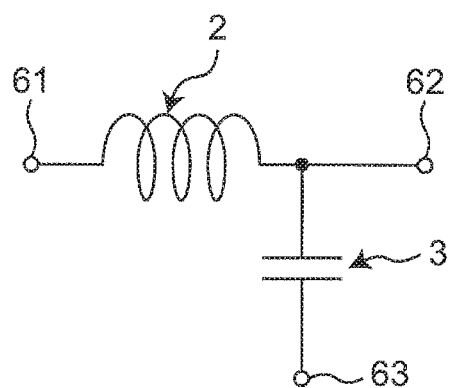
FIG. 3 is an equivalent circuit diagram of the electronic component.

FIG. 1 is a cross-sectional view of a first embodiment of an electronic component of the present disclosure. FIG. 2A is a cross-sectional view taken along 1-1 of FIG. 1. FIG. 2B is a cross-sectional view taken along 2-2 of FIG. 1. FIG. 2C is a cross-sectional view taken along 3-3 of FIG. 1. FIG. 3 is an equivalent circuit diagram of the electronic component. As shown in FIGS. 1, 2A to 2C, and 3, an electronic component 10 is an LC composite type electronic component having a coil 2 and a capacitor 3. The electronic component 10 is mounted on an electronic device such as a personal computer, a DVD player, a digital camera, a TV, a portable telephone, and automotive electronics, for example. The electronic component 10 is used as an LC filter such as a low-pass filter, a high-pass filter, a band-pass filter, and a trap filter, for example.

The electronic component 10 has a substrate 1, a coil 2 and a capacitor 3 disposed on the substrate 1 and electrically connected to each other, and an insulator 4 covering the coil 2 and the capacitor 3. One end of the coil 2 is connected to a first terminal 61. The other end of the coil 2 is connected to a second terminal 62. One end of the capacitor 3 is connected to the other end of the coil 2 and the second terminal 62. The other end of the capacitor 3 is connected to a third terminal 63.

The substrate 1 is made of ceramic, glass, semiconductor, a composite material of an organic material and an inorganic material, etc. In this embodiment, the substrate 1 is, for example, a ceramic substrate mainly made of alumina.

The coil 2 includes two layers of a first coil conductor 21 and a second coil conductor 22. The first and second coil conductors 21, 22 are arranged in order from a lower layer to an upper layer. The first and second coil conductors 21, 22 are electrically connected in a lamination direction. The first and second coil conductors 21, 22 are each formed into a spiral shape on a plane. The first and second coil conductors 21, 22 are made of low-resistance metal such as Cu, Ag, and Au, for example. Preferably, low-resistance and narrow-pitch spiral wirings can be formed by using Cu plating formed by a semi-additive process (SAP) method.

The first and second coil conductors 21, 22 are arranged around the same axis. The first coil conductor 21 and the second coil conductor 22 are wound in the same direction when viewed in the axis direction (lamination direction).

The first coil conductor 21 has an inner circumferential end part 21a and an outer circumferential end part 21b. The second coil conductor 22 has an inner circumferential end part 22a and an outer circumferential end part 22b. The inner circumferential end part 21a of the first coil conductor 21 and the inner circumferential end part 22a of the second coil conductor 22 are electrically connected through a via wiring 23 extending in the lamination direction. The outer circumferential end part 21b of the first coil conductor 21 is electrically connected to the second terminal 62. The outer circumferential end part 22b of the second coil conductor 22 is electrically connected to the first terminal 61.

The capacitor 3 includes two layers of a lower electrode 31 and an upper electrode 32. The lower electrode 31 and the upper electrode 32 are arranged in order from a lower layer to an upper layer. The lower electrode 31 and the upper electrode 32 are separately arranged in the lamination direction. The lower electrode 31 and the upper electrode 32 are each formed into a flat plate shape. The lower electrode 31 and the upper electrode 32 are made of the same material as the first and second coil conductors 21, 22, for example.

The lower electrode 31 is electrically connected to the third terminal 63 through a lead wiring 24 extending in a planar direction. The upper electrode 32 is electrically connected to the second terminal 62 through a lead wiring 24 extending in a planar direction.

The insulator 4 includes three layers of first to third insulating layers 41 to 43. The first to third insulating layers 41 to 43 are arranged in order from a lower layer to an upper layer. The first to third insulating layers 41 to 43 are made of, for example, an organic material containing epoxy, phenol, polyimide, bismaleimide, and LCP as a main component or an inorganic material such as glass and silicon nitride. In this embodiment, for example, glass is used for the first insulating layer 41, and a polyimide resin is used for the second and third insulating layers 42, 43.

An inorganic dielectric layer 5 is disposed between the first insulating layer 41 and the second insulating layer 42. The inorganic dielectric layer 5 preferably contains an inorganic dielectric material and a glass material having a softening point lower than the softening point of the inorganic dielectric material. A ratio of the glass material contained in the inorganic dielectric layer 5 is preferably 15 wt % or more and 35 wt % or less.

The inorganic dielectric material is, for example, alumina, aluminum nitride, silica, silicon nitride, tantalum oxide, niobium oxide, titanium oxide, strontium titanate, barium strontium titanate, and lead zirconate titanate. The glass material is, for example, a low-softening point glass having a softening point of 700° C. or less such as borosilicate glass.

In this embodiment, for example, the inorganic dielectric layer 5 is made of a material containing barium titanate (Ba, Ti, O) and borosilicate glass (B, Si, Ba, O). The ratio of the glass material is 20 wt %, for example.

The first insulating layer 41 is disposed on the substrate 1 and the capacitor lower electrode 31 is disposed on the first insulating layer 41. The inorganic dielectric layer 5 is disposed on the first insulating layer 41 to cover the lower electrode 31.

The capacitor upper electrode 32 is directly disposed on the inorganic dielectric layer 5, and the upper electrode 32 faces the lower electrode 31 via the inorganic dielectric layer 5. In this way, the lower electrode 31, the upper electrode 32, and the inorganic dielectric layer 5 between the lower electrode 31 and the upper electrode 32 constitute the capacitor 3.

A thickness $T_{51}$ of a portion lateral to the lower electrode 31 in the inorganic dielectric layer 5 is thicker than a thickness $T_{52}$ of a portion between the lower electrode 31 and the upper electrode 32 in the inorganic dielectric layer 5. An upper surface 5a of the inorganic dielectric layer 5 is flat. In this case, being flat means that a maximum height between a recess and a protrusion in a surface uneven shape is 1 μm or less.

The first coil conductor 21 is directly disposed on the inorganic dielectric layer 5, and the first coil conductor 21 is electrically connected to the upper electrode 32. The second insulating layer 42 is disposed on the inorganic dielectric layer 5 to cover the upper electrode 32 and the first coil conductor 21. The second coil conductor 22 is disposed on the second insulating layer 42, and the third insulating layer 43 is disposed on the second insulating layer 42 to cover the second coil conductor 22.

The coil 2 (the first and second coil conductors 21, 22) and the lower electrode 31 are separated in the horizontal direction without facing each other. The horizontal direction is the direction orthogonal to the vertical direction. The coil 2 does not overlap the lower electrode 31 when viewed in the horizontal direction.

A method of manufacturing the electronic component 10 will be described.

Figure 4A:
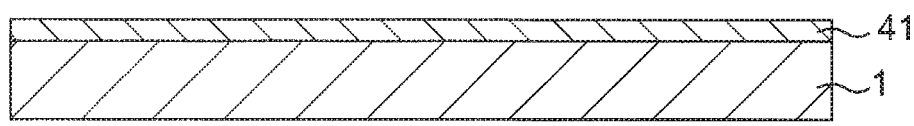
FIG. 4A is an explanatory view for explaining a manufacturing method of the electronic component.

As shown in FIG. 4A, the first insulating layer 41 is laminated on the substrate 1. In this embodiment, the substrate 1 is a ceramics substrate mainly made of alumina, and the first insulating layer 41 is formed of a mixed paste material of borosilicate glass and a binder applied as a film to the substrate 1 by a printing method and then baked by a baking process at approx. 800° C. When the baking temperature is high at the time of formation of the inorganic dielectric layer 5, a re-melting temperature is desirably made higher by selecting the glass material crystallizing due to the baking process.

Figure 4B:
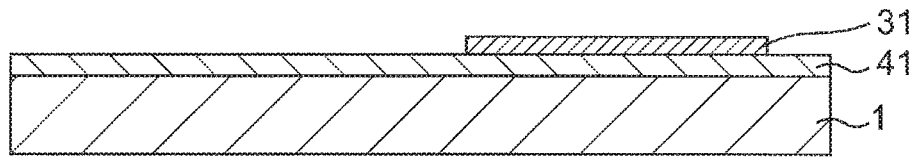
FIG. 4B is an explanatory view for explaining a manufacturing method of the electronic component.

Subsequently, as shown in FIG. 4B, the capacitor lower electrode 31 is disposed on the first insulating layer 41. In this embodiment, after a plating power feeding film (seed layer) made of Ti and Cu is formed by a sputtering method, a Cu wiring is patterned by using a photosensitive photoresist. Subsequently, a pattern part is selectively subjected to electrolytic Cu plating followed by peeling of the photosensitive resist and etching of a seed film to form the lower electrode 31. This wiring formation process will hereinafter be referred to as a SAP (semi-additive process) method.

Figure 4C:
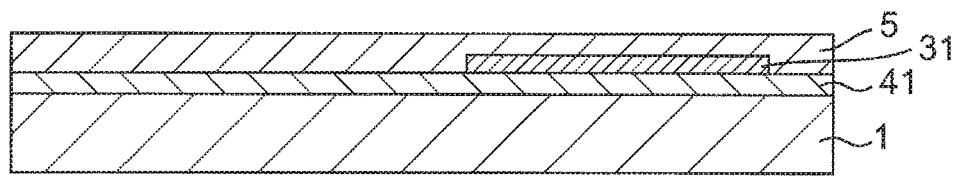
FIG. 4C is an explanatory view for explaining a manufacturing method of the electronic component.

Subsequently, as shown in FIG. 4C, the inorganic dielectric layer 5 is disposed on the first insulating layer 41 to cover the lower electrode 31. In this embodiment, a paste made of borosilicate glass, TiBaO, a sintering additive, and a binder is applied as a film by a printing method and baked by a baking process at approx. 900° C. to 1000° C. to make up the inorganic dielectric layer 5. The thickness of the inorganic dielectric layer 5 generated at the times of printing and baking is leveled to flatten the unevenness on the first insulating layer 41 due to the lower electrode 31 so that the inorganic dielectric layer 5 is formed flat relative to the substrate 1. Therefore, the thickness of the inorganic dielectric layer 5 on the lower electrode 31 can be made thicker than the thickness of the inorganic dielectric layer 5 on the other portion. The inorganic dielectric layer 5 on the lower electrode 31 may mechanically and selectively be thinned or flattened as needed by grinding, polishing, lapping, etc.

Figure 4D:
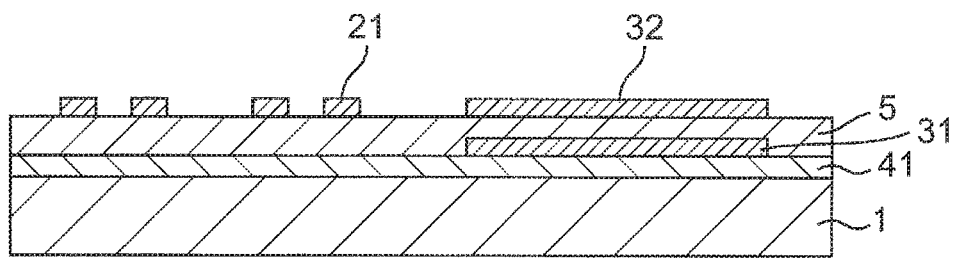
FIG. 4D is an explanatory view for explaining a manufacturing method of the electronic component.

Subsequently, as shown in FIG. 4D, the capacitor upper electrode 32 and the first coil conductor 21 are disposed on the inorganic dielectric layer 5. In this embodiment, the upper electrode 32 and the first coil conductor 21 are formed by the SAP method.

Figure 4E:
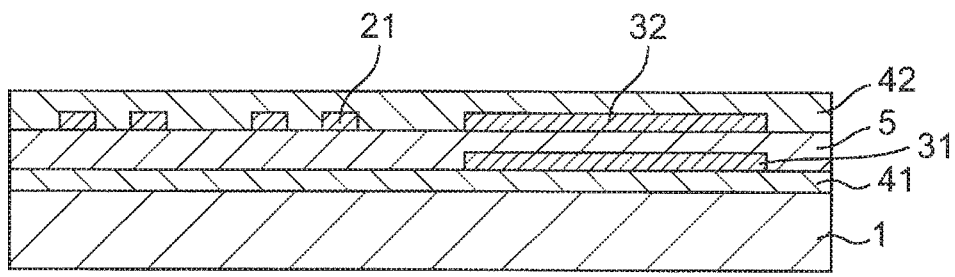
FIG. 4E is an explanatory view for explaining a manufacturing method of the electronic component.

Subsequently, as shown in FIG. 4E, the second insulating layer 42 is disposed on the inorganic dielectric layer 5 to cover the upper electrode 32 and the first coil conductor 21. In this embodiment, polyimide is applied and then cured to form the second insulating layer 42.

Figure 4F:
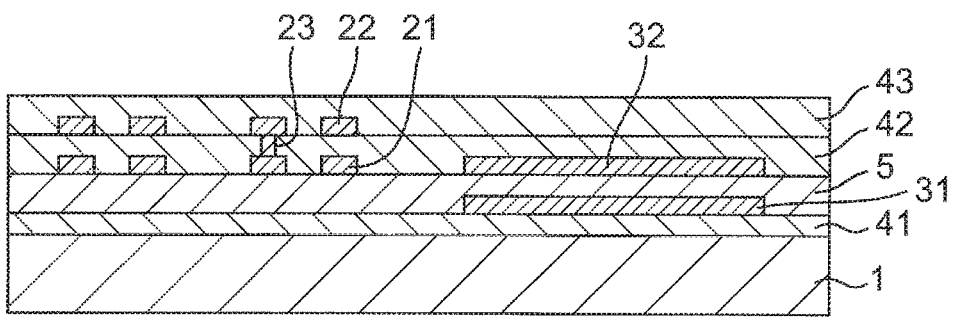
FIG. 4F is an explanatory view for explaining a manufacturing method of the electronic component.

Subsequently, as shown in FIG. 4F, the second coil conductor 22 is disposed on the second insulating layer 42. In this process, a via hole is formed in the second insulating layer 42 by laser processing etc., and the via wiring 23 is formed in the via hole. As a result, the second coil conductor 22 is electrically connected through the via wiring 23 to the first coil conductor 21. The second coil conductor 22 and the via wiring 23 are formed by the SAP method.

The third insulating layer 43 is disposed on the second insulating layer 42 to cover the second coil conductor 22. In this embodiment, polyimide is applied and then cured to form the third insulating layer 43.

Subsequently, the substrate 1 is diced or scribed into individual pieces in a component size to form the electronic component 10 shown in FIG. 1.

According to the electronic component 10, since the coil 2 is disposed on the inorganic dielectric layer 5, the stray capacitance between the wirings of the coil 2 (inductor) does not increase in the inorganic dielectric layer 5, so that a reduction in performance of the coil 2 can be suppressed.

According to the electronic component 10, the thickness $T_{51}$ of the portion lateral to the lower electrode 31 in the inorganic dielectric layer 5 is thicker than the thickness $T_{52}$ of the portion between the lower electrode 31 and the upper electrode 32 in the inorganic dielectric layer 5, and the upper surface 5a of the inorganic dielectric layer 5 is flat. Therefore, the inorganic dielectric layer 5 does not have a shape along the lower electrode 31.

As a result, the inorganic dielectric layer 5 can be made thicker in film thickness in a portion covering a lower edge part 31a and an upper edge part 31b of the lower electrode 31. Therefore, the inorganic dielectric layer 5 can be prevented from deteriorating in coverage of the upper and lower edge parts 31a, 31b of the lower electrode 31 and, even when thermal distortion etc. are generated, a structural defect such as a crack can be prevented in the portion covering the upper and lower edge parts 31a, 31b of the lower electrode 31 in the inorganic dielectric layer 5. Therefore, the reliability of quality can be restrained from degrading.

The thickness of the inorganic dielectric layer 5 can be made thinner between the lower electrode 31 and the upper electrode 32 so that a reduction in capacitance of the capacitor 3 can be prevented. Therefore, the performance can be prevented from deteriorating due to a reduction in capacitance of the capacitor 3.

According to the electronic component 10, since the coil 2 and the lower electrode 31 are separated in the horizontal direction without facing each other, the stray capacitance can be reduced in the inorganic dielectric layer 5 between the coil 2 and the lower electrode 31.

According to the electronic component 10, preferably, the inorganic dielectric layer 5 contains an inorganic dielectric material and a glass material having a softening point lower than the softening point of the inorganic dielectric material. As a result, at the time of manufacturing (printing and baking) of the inorganic dielectric layer 5, the glass material softens before sintering of the inorganic dielectric material, resulting in better fluidity of the inorganic dielectric layer 5. This leads to an improvement in leveling property of the inorganic dielectric layer 5 so that the upper surface 5a of the inorganic dielectric layer 5 is formed smooth.

According to the electronic component 10, preferably, a ratio of the glass material contained in the inorganic dielectric layer 5 is 15 wt % or more and 35 wt % or less and, therefore, the permittivity of the inorganic dielectric layer 5 is improved. In this regard, a smaller ratio of the glass material leads to a reduction in the fluidity and a deterioration in the sintering property, resulting in a lower permittivity. On the other hand, a larger ratio of the glass material leads to a reduction in the ratio of the inorganic dielectric material, resulting in a lower permittivity.

Figure 5:
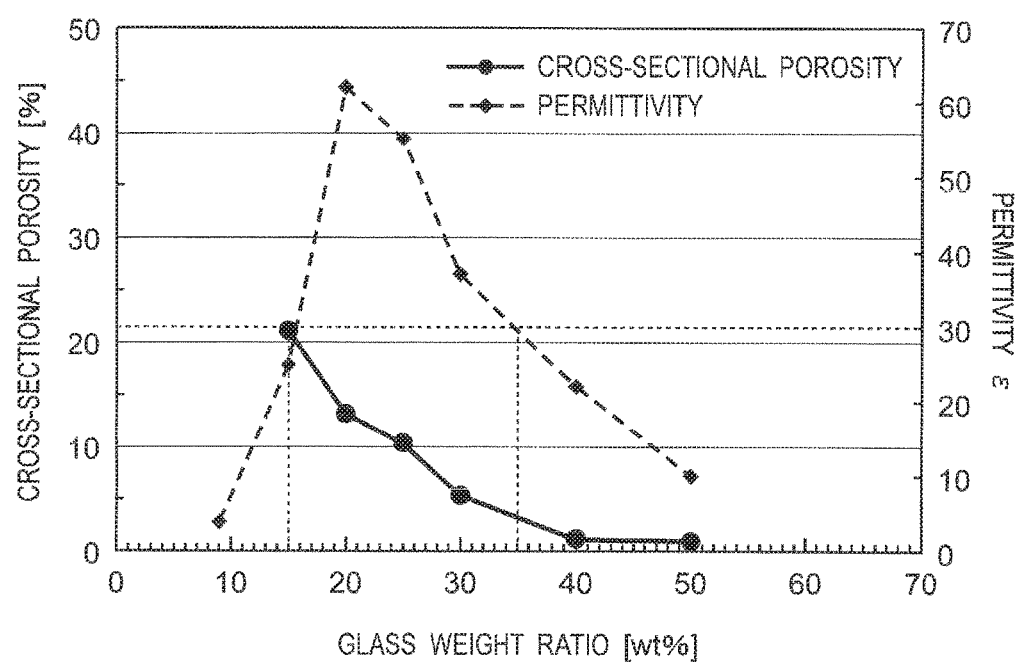
FIG. 5 is a graph of relations of a ratio of a glass material to a cross-sectional porosity and a permittivity of an inorganic dielectric layer.

FIG. 5 shows relations of the ratio of the glass material to the cross-sectional porosity and the permittivity of the inorganic dielectric layer. The horizontal axis indicates the ratio [wt %] of the glass material, and the left vertical axis indicates the cross-sectional porosity [%] while the left vertical axis indicates the permittivity ε. A solid line represents the relation of the ratio of the glass material to the cross-sectional porosity of the inorganic dielectric layer, and a dotted line represents the relation of the ratio of the glass material to the permittivity of the inorganic dielectric layer.

For the cross-sectional porosity [%], a cross section of the inorganic dielectric layer was exposed by polishing, ion milling, etc., and observed by using equipment such as a SEM enabling observation at high magnitude, and areas of inorganic dielectric material parts and void parts of the sample cross section were calculated from image analysis so as to acquire a percentage of voids of the observed region as the cross-sectional porosity.

The permittivity ε is a value acquired by multiplying a relative permittivity by a permittivity of vacuum and the relative permittivity was calculated by measuring an electric capacitance stored between electrodes when voltage/frequency was applied to electrode materials formed on upper and lower surfaces of an inorganic dielectric layer.

As indicated by the solid line of FIG. 5, as the ratio of the glass material becomes smaller, the cross-sectional porosity of the inorganic dielectric layer becomes larger. In other words, as the cross-sectional porosity of the inorganic dielectric layer becomes larger, the fluidity of the inorganic dielectric layer decreases. As indicated by the dotted line of FIG. 5, when the ratio of the glass material becomes smaller or larger than a constant value, the permittivity of the inorganic dielectric layer becomes smaller. Therefore, when the ratio of the glass material is 15 wt % or more and 35 wt % or less, the permittivity of the inorganic dielectric layer can be made higher.

In the relation between the ratio of the glass material and the permittivity of the inorganic dielectric layer, the maximum value of the permittivity differs depending on a kind of the inorganic dielectric material; however, the maximum value of the permittivity falls within the range of the ratio of the glass material from 15 wt % to 35 wt % regardless of the kind of the inorganic dielectric material.

Second Embodiment

Figure 6:
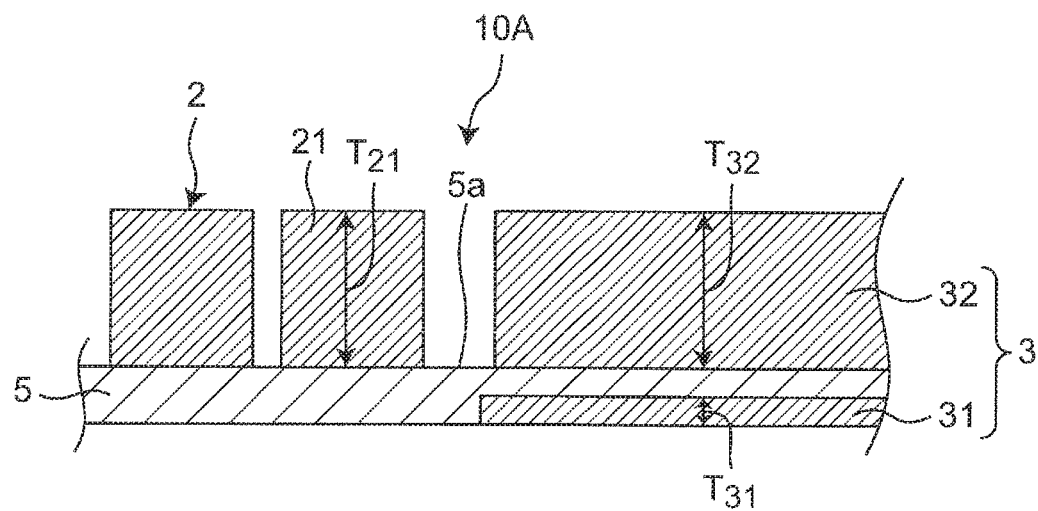
FIG. 6 is a cross-sectional view of a second embodiment of an electronic component of the present disclosure.

FIG. 6 is a cross-sectional view of a second embodiment of an electronic component of the present disclosure. The second embodiment is different from the first embodiment in the thicknesses of the coil conductors and the capacitor electrodes. This different configuration will hereinafter be described. In the second embodiment, the same constituent elements as the first embodiment are denoted by the same reference numerals as the first embodiment and therefore will not be described.

As shown in FIG. 6, in an electronic component 10A of the second embodiment, a thickness $T_{21}$ of the first coil conductor 21 of the coil 2 is thicker than a thickness $T_{31}$ of the lower electrode 31 of the capacitor 3. As a result, a direct current resistance value of the coil 2 can be made smaller to improve the coil characteristics. In other words, since the first coil conductor 21 is not disposed on the same layer as the lower electrode 31, the thickness $T_{31}$ of the lower electrode 31 can be formed thinner. In contrast, when the first coil conductor 21 is disposed on the same layer as the lower electrode 31 and the thickness $T_{31}$ of the lower electrode 31 is formed thinner, the thickness $T_{21}$ of the first coil conductor 21 also becomes thinner, resulting in an increase in direct current resistance of the inductor.

The thickness $T_{32}$ of the upper electrode 32 is the same as the thickness $T_{21}$ of the first coil conductor 21. The thickness of the second coil conductor may be the same as, or thinner than, the thickness $T_{21}$ of the first coil conductor 21. Therefore, at least a portion of the coil 2 is thicker than the thickness $T_{31}$ of the lower electrode 31.

In this embodiment, the thickness of the coil 2 (the first and second coil conductors 21, 22) is 5 μm or more and 15 μm or less, and the thickness $T_{31}$ of the lower electrode 31 is 1 μm or less. As a result, the electronic component with a small direct current resistance value can be formed by the SAP method.

When the coil 2 is fabricated by the SAP method, the wirings of the coil 2 have L (linewidth)/S (wiring space (wiring pitch))/t (wiring thickness) of 8/5/7 μm, 5/5/10 μm, 8/5/12 μm, or 10.3/5.6/7.4 μm, for example. By setting the thickness of the coil 2 to 5 μm or more and 15 μm or less in this way, the thickness falls within a range in which the coil 2 can be fabricated by the SAP method. Additionally, by making the thickness $T_{31}$ of the lower electrode 31 equal to or less than 1 μm, the coil can be set to a thickness controllable by the SAP method.

Third Embodiment

Figure 7:
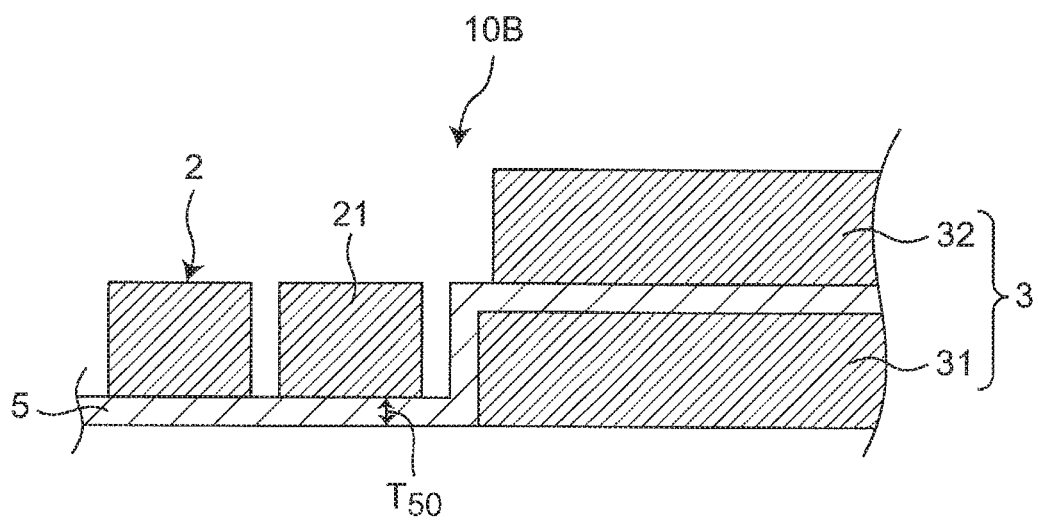
FIG. 7 is a cross-sectional view of a third embodiment of an electronic component of the present disclosure.

FIG. 7 is a cross-sectional view of a third embodiment of an electronic component of the present disclosure. The third embodiment is different from the first embodiment in the thickness of the inorganic dielectric layer. This different configuration will hereinafter be described. In the third embodiment, the same constituent elements as the first embodiment are denoted by the same reference numerals as the first embodiment and therefore will not be described.

As shown in FIG. 7, in an electronic component 10B of the third embodiment, a thickness $T_{50}$ of the inorganic dielectric layer 5 is constant and the inorganic dielectric layer 5 is formed in conformity to the shape of the lower electrode 31. Also in this configuration, since the coil 2 is disposed on the inorganic dielectric layer 5 as is the case with the first embodiment, the stray capacitance between the wirings of the coil 2 (inductor) does not increase in the inorganic dielectric layer 5, so that a reduction in performance of the coil 2 can be suppressed.

Fourth Embodiment

Figure 8:
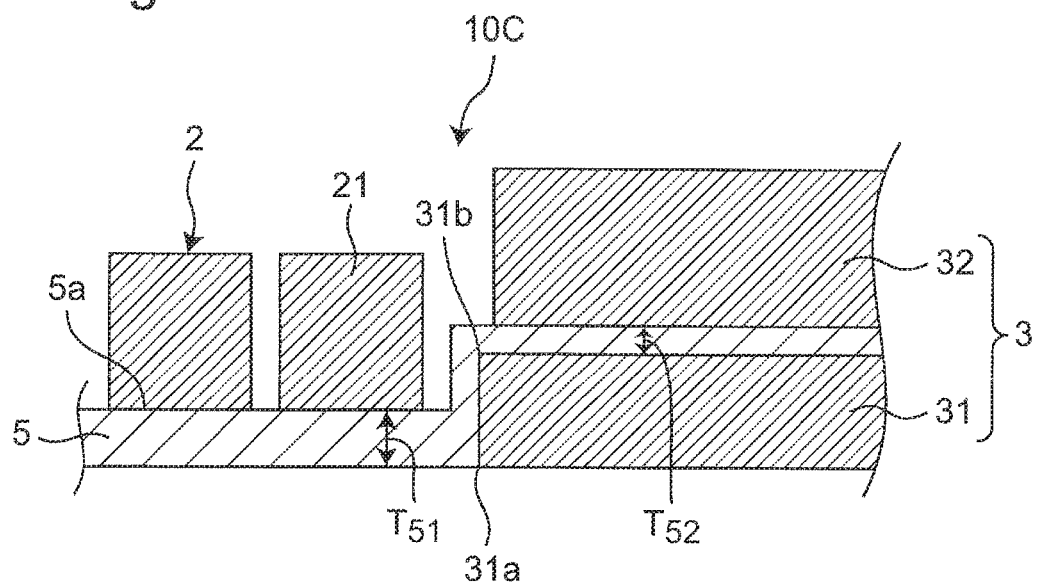
FIG. 8 is a cross-sectional view of a fourth embodiment of an electronic component of the present disclosure.

FIG. 8 is a cross-sectional view of a fourth embodiment of an electronic component of the present disclosure. The fourth embodiment is different from the first embodiment in the thickness of the inorganic dielectric layer. This different configuration will hereinafter be described. In the fourth embodiment, the same constituent elements as the first embodiment are denoted by the same reference numerals as the first embodiment and therefore will not be described.

As shown in FIG. 8, in an electronic component 10C of the fourth embodiment, the upper surface 5a of the inorganic dielectric layer 5 is not flat and the thickness $T_{51}$ of the portion lateral to the lower electrode 31 in the inorganic dielectric layer 5 is thicker than the thickness $T_{52}$ of the portion between the lower electrode 31 and the upper electrode 32 in the inorganic dielectric layer 5.

As a result, the inorganic dielectric layer 5 can be made thicker in film thickness in a portion covering a lower edge part 31a of the lower electrode 31. Therefore, the inorganic dielectric layer 5 can be prevented from deteriorating in coverage of the upper and lower edge parts 31a, 31b of the lower electrode 31 and, even when thermal distortion etc. are generated, a structural defect such as a crack can be prevented in the portion covering the upper and lower edge parts 31a, 31b of the lower electrode 31 in the inorganic dielectric layer 5. Therefore, the reliability of quality can be restrained from degrading.

The thickness of the inorganic dielectric layer 5 can be made thinner between the lower electrode 31 and the upper electrode 32 so that a reduction in capacitance of the capacitor 3 can be prevented. Therefore, the performance can be prevented from deteriorating due to a reduction in capacitance of the capacitor 3.

Fifth Embodiment

Figure 9:
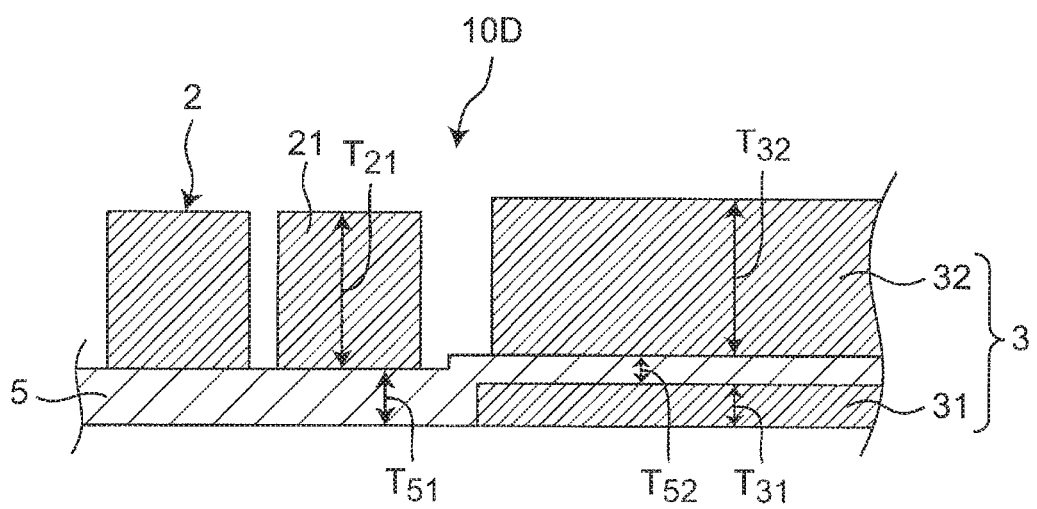
FIG. 9 is a cross-sectional view of a fifth embodiment of an electronic component of the present disclosure.

FIG. 9 is a cross-sectional view of a fifth embodiment of an electronic component of the present disclosure. The fifth embodiment is different from the fourth embodiment in the thicknesses of the coil conductors and the capacitor electrodes. This different configuration will hereinafter be described. In the fifth embodiment, the same constituent elements as the fourth embodiment are denoted by the same reference numerals as the fourth embodiment and therefore will not be described.

As shown in FIG. 9, in an electronic component 10D of the fifth embodiment, the thickness $T_{21}$ of the first coil conductor 21 of the coil 2 is thicker than the thickness $T_{31}$ of the lower electrode 31 of the capacitor 3. As a result, the direct current resistance value of the coil 2 can be made smaller to improve the coil characteristics. The thicknesses of the coil 2 and the capacitor 3 are the same as those of the second embodiment and therefore will not be described in detail.

By making the thickness $T_{51}$ of the portion lateral to the lower electrode 31 in the inorganic dielectric layer 5 thicker than the thickness $T_{52}$ of the portion between the lower electrode 31 and the upper electrode 32 in the inorganic dielectric layer 5 as is the case with the fourth embodiment and making the thickness $T_{31}$ of the lower electrode 31 thinner than the thickness $T_{21}$ of the first coil conductor 21 as is the case with the second embodiment, the coil 2 (the first and second coil conductors 21, 22) and the lower electrode 31 can be separated in the horizontal direction without facing each other. As a result, the stray capacitance can be reduced in the inorganic dielectric layer 5 between the coil 2 and the lower electrode 31.

The present disclosure is not limited to the embodiments described above and may be changed in design without departing from the spirit of the present disclosure. For example, respective feature points of the first to fifth embodiments may variously be combined.

Although the number of the coil conductors constituting the coil is two in the embodiment, the number of the coil conductors may be one or three or more.

Although the insulator is made up of the first to third insulating layers in the embodiment, the first insulating layer may not be included, or the insulator may be made up of one, two, or four or more layers.

Although the coil is electrically connected to the upper electrode in the embodiment, the coil may electrically be connected to the lower electrode.

The invention claimed is:

1. An electronic component comprising:
   a substrate;
   a capacitor lower electrode disposed on the substrate;
   an inorganic dielectric layer disposed on the substrate to cover the lower electrode;
   a capacitor upper electrode disposed directly on the inorganic dielectric layer and facing the lower electrode via the inorganic dielectric layer;
   a coil disposed directly on a top surface of the inorganic dielectric layer and electrically connected to the lower electrode or the upper electrode; and
   an insulating layer disposed to cover the coil and the capacitor upper electrode,
   wherein the insulating layer and the inorganic dielectric layer are made from different materials.

2. The electronic component according to claim 1, wherein a thickness of a portion lateral to the lower electrode in the inorganic dielectric layer is thicker than a thickness of a portion between the lower electrode and the upper electrode in the inorganic dielectric layer.

3. The electronic component according to claim 1, wherein the top surface of the inorganic dielectric layer is flat.

4. The electronic component according to claim 1, wherein the coil and the lower electrode are separated in a horizontal direction without facing each other.

5. An electronic component comprising:
   a substrate;
   a capacitor lower electrode disposed on the substrate;
   an inorganic dielectric layer disposed on the substrate to cover the lower electrode;
   a capacitor upper electrode disposed directly on the inorganic dielectric layer and facing the lower electrode via the inorganic dielectric layer; and
   a coil disposed on the inorganic dielectric layer and electrically connected to the lower electrode or the upper electrode,
   wherein a thickness in a vertical direction of the electronic component, the vertical direction being transverse to a surface of the substrate, of at least a portion of a coil conductor constituting the coil is thicker than a thickness in the vertical direction of the electronic component, the vertical direction being transverse to the surface of the substrate, of the lower electrode.

6. The electronic component according to claim 5, wherein the thickness of at least the portion of the coil conductor is 5 µm or more and 15 µm or less, and the thickness of the lower electrode is 1 µm or less.

7. An electronic component comprising:
- a substrate;
- a capacitor lower electrode disposed on the substrate;
- an inorganic dielectric layer disposed on the substrate to cover the lower electrode;
- a capacitor upper electrode disposed directly on the inorganic dielectric layer and facing the lower electrode via the inorganic dielectric layer; and
- a coil disposed directly on a top surface of the inorganic dielectric layer and electrically connected to the lower electrode or the upper electrode,
- wherein the inorganic dielectric layer contains an inorganic dielectric material and a glass material, and
- wherein a ratio of the glass material contained in the inorganic dielectric layer is 15 wt % or more and 35 wt % or less.

8. The electronic component according to claim 7, wherein the glass material has a softening point lower than a softening point of the inorganic dielectric material.

9. The electronic component according to claim 7, wherein the inorganic dielectric material contains barium titanate and the glass material contains borosilicate glass.

10. The electronic component according to claim 9, wherein a ratio of the glass material contained in the inorganic dielectric layer is 20 wt %.

11. An electronic component comprising:
- a substrate;
- a capacitor lower electrode disposed on the substrate;
- an inorganic dielectric layer disposed on the substrate to cover the lower electrode;
- a capacitor upper electrode disposed directly on the inorganic dielectric layer and facing the lower electrode via the inorganic dielectric layer; and
- a coil disposed directly on a top surface of the inorganic dielectric layer and electrically connected to the lower electrode or the upper electrode,
- wherein the inorganic dielectric layer contains an inorganic dielectric material and a glass material, and
- wherein a thickness of a portion lateral to the lower electrode in the inorganic dielectric layer is thicker than a thickness of a portion between the lower electrode and the upper electrode in the inorganic dielectric layer.

* * * * *